(12) United States Patent
Cole (10) Patent No.: US 7,098,670 B2
(45) Date of Patent: Aug. 29, 2006

(54) METHOD AND SYSTEM OF CHARACTERIZING A DEVICE UNDER TEST

(76) Inventor: J. Bradford Cole, 48 Russell's Way, Westford, MA (US) 01886

( * ) Notice: Subject to any disclaimer, the term of this patent is extended or adjusted under 35 U.S.C. 154(b) by 87 days.

(21) Appl. No.: 10/791,347

(22) Filed: Mar. 2, 2004

(65) Prior Publication Data

US 2005/0194981 A1 Sep. 8, 2005

(51) Int. Cl.
*G01R 27/28* (2006.01)
*G01R 35/00* (2006.01)

(52) U.S. Cl. .................. 324/615; 324/638; 324/601

(58) Field of Classification Search .............. 324/601, 324/613, 615, 638, 674
See application file for complete search history.

(56) References Cited

U.S. PATENT DOCUMENTS

| 4,816,767 A | * | 3/1989 | Cannon et al. ............. 324/601 |
| 5,502,392 A | * | 3/1996 | Arjavalingam et al. ..... 324/638 |
| 5,946,482 A | * | 8/1999 | Barford et al. ............... 703/14 |
| 6,653,848 B1 | * | 11/2003 | Adamian et al. ........... 324/615 |

* cited by examiner

*Primary Examiner*—Anjan Deb
*Assistant Examiner*—Timothy J. Dole
(74) *Attorney, Agent, or Firm*—Iandiorio & Teska (57) ABSTRACT

A system and method of characterizing a device under test wherein a signal is injected into the device under test, the response to the injected signal is measured to determine the impedance of the device under test in the frequency domain, the impedance is converted to the time domain, and the voltage noise of the device under test is calculated based on the impedance of the device under test in the time domain.

104 Claims, 4 Drawing Sheets

METHOD AND SYSTEM OF CHARACTERIZING A DEVICE UNDER TEST

FIELD OF THE INVENTION

This invention relates to a method and system of characterizing a device under test to determine the voltage noise of a device and to otherwise evaluate the power delivery network and signal return planes of electronic systems.

BACKGROUND OF THE INVENTION

The power delivery systems (e.g., the network and signal return planes) of printed circuit boards, integrated circuit packages, and other systems, devices, and components, (e.g., interconnect components such as wire bonds and vias), are routinely tested for voltage noise. The power delivery network of a printed circuit board, for example, consists of Vcc (supply voltage) pads and ground pads and the power plane and ground plane, and/or conductive traces in or on the printed circuit board which lead to other pads or to a connector or the like. In general, power delivery networks transfer electrical power from a power supply to an electronic circuit. Generally speaking, for a given supply voltage, the more current the electronic circuit draws, the lower the impedance of the power delivery system must be over a specified frequency bandwidth to maintain a given amount of transient voltage switching noise. Furthermore, the more quickly the electronic circuit draws current through the power delivery system, the wider the frequency bandwidth must be in order to maintain a given amount of transient voltage switching noise. The same is true of return planes for signal paths, especially when the return current splits so that it is carried by more than one plane, or when the current in the return path changes layers from one plane to another. Typically the planes for the signal return path are the same as those used for power delivery. Therefore, the same considerations apply regarding the design and characterization of planes whether they are used as part of a power delivery network, a signal return path, or both.

As electronic circuits operate at faster speeds, and as printed circuit boards and integrated circuits become more complex, they require larger amounts of current. Furthermore, as supply voltages are decreased to reduce overall system power consumption, the maximum allowable impedance of the power delivery system is reduced and the bandwidth is increased. Therefore, the electrical performance of power delivery systems is becoming more critical to overall electronic system performance, and power delivery systems are simultaneously becoming increasingly challenging to design, measure, and characterize.

A typical approach to determining the electrical impedance requirement of a power delivery network is to divide the maximum allowable variation in the voltage at a terminal by the maximum change in the amount of current that is drawn from the power delivery network. The bandwidth over which this impedance must be maintained is typically determined by dividing a constant number by the amount of time allowed for the current to switch from its minimum value to its maximum value. The constant number is typically chosen to be approximately 0.35, but in practice can range from 0.2 to 1.0.

Although this technique is one commonly applied methodology to determine the electrical performance requirements of a power delivery network, it can be shown that this technique will always over-constrain the design of the power delivery network. The result is a device that is more expensive to design, a design which takes longer to complete, and a product which takes longer to bring to market than if the prior proper criteria were used. The increased costs are due to the increased amount of engineering design and measurement time, the increased bill-of-materials costs resulting from components which are not required, and the opportunity costs resulting from delays to the introduction of a new product to the market.

The principle problem with the currently used technique is that is mixes time domain and frequency domain performance requirements. The voltage noise transient is, by definition, defined in the time domain, as is the change in current supplied to a device. However, the power delivery system impedance is defined over a bandwidth and is therefore defined in the frequency domain. If does not follow then, in general, that dividing two terms that are functions of time (voltage and current) will result in a term that is a function of frequency, namely impedance.

In the prior art, one test port of a network analyzer could be used to inject a voltage signal into the power delivery system of a device under test (printed circuit board, integrated circuit package, or the like). Another test port of the network analyzer is used to measure the response of the device under test to determine the self-impedance of the power delivery system. An s-parameter matrix, known to those skilled in the art, is constructed based on the response of the power delivery system. The measured s-parameters allow the impedance of the power delivery system to be calculated as a function of frequency. Then, however, the calculated impedance as a function of frequency is improperly used to determine the transient noise. Since the specified current is in the time domain and the measured impedance is in the frequency domain, multiplying these two terms together is the equivalent of mismatching units (e.g., miles per hour added to pounds).

The result is that a device under test which does in fact meet a specified maximum voltage noise requirement is tested and incorrectly determined to exceed the specified maximum voltage noise. A redesign effort then must be conducted to lower the maximum voltage noise resulting in more expensive designs, designs which take longer to complete, and product which take longer to bring to market.

There is in fact the mathematical relationship between the time domain and the frequency domain representations of a parameter. The concept of a time domain representation of impedance, however, is not generally recognized and the application of such a concept is not described in the literature.

SUMMARY OF THE INVENTION

It is therefore an object of this invention to more correctly determine the voltage noise of a device under test.

It is a further object of this invention to provide a system and method which reduces the costs associated with designing printed circuit board, integrated circuit packages, and other electronic devices and systems.

It is a further object of this invention to provide such a system and method which reduces the design time associated with printed circuit boards, integrated circuit packages, and other electronic devices and systems.

It is a further object of this invention to provide such a system and method which can be used to measure self-impedance, transfer impedance, simultaneous switching noise, and even the worst case scenario for total voltage noise.

It is a further object of this invention to provide such a system and method which can be used to measure the voltage noise of a physical device such as a printed circuit board and also a digital representation of a device during simulation on a computer.

The subject invention results from the realization that the designs of printed circuit boards, integrated circuit packages, and other electronic devices and systems have been over-constrained because present test methods and systems improperly mix time domain and frequency domain performance requirements and that the voltage noise of such devices and systems can be more accurately determined by calculating the impedance of the power delivery network or a pair of planes as a function of time and then convolving the calculated impedance with a specified current waveform to reduce the cost and time associated with designing and manufacturing printed circuit boards, integrated circuit packages, and other electronic devices and systems.

This invention features a method of characterizing a device under test. The method comprising injecting a signal into the device under test, measuring the response to the injected signal to determine the impedance of the device under test in the frequency domain, converting the impedance of the device under test to the time domain, and calculating the voltage noise of the device under test based on the impedance of the device under test in the time domain.

In the preferred embodiment, the step of measuring the response includes constructing an s-parameter matrix and calculating the real and imaginary portions of the impedance of the device under test as a function of frequency based on the s-parameter matrix. In one example, the step of constructing the s-parameter matrix includes establishing calibration data, generating an uncorrected s-parameter matrix based on the measured impedance of the device under test, and applying the calibration data to the uncorrected s-parameter matrix to produce a corrected s-parameter matrix. Converting typically includes performing an inverse Fourier transform on the impedance in the frequency domain and calculating the voltage noise of the device under test includes convolving the impedance in the time domain with a predetermined current in the time domain.

Determining the self-impedance of the device under test includes measuring, at a terminal pair of the device under test using one test port of an analyzer, the response to a signal input to the terminal pair from a different test port of the analyzer. Determining the transfer impedance of the device under test includes measuring, at one terminal pair of the device under test using one test port of an analyzer, the response to a signal input to a different terminal pair of the device under test from a different test port of the analyzer. The simultaneous switching noise may also be determined by measuring the response of a plurality of terminal pairs of the device under test. The voltage noise of each terminal pair of the device under test is calculated and the simultaneous switching noise is the sum of the voltage noise of each terminal of the device under test.

In another example, the device under test has multiple terminal pairs, a signal is input to each terminal pair simultaneously, and the calculated voltage noise of each terminal pair is adjusted until a maximum total voltage noise is achieved to determine a worst case scenario concerning timing of the signal input to each terminal pair and the resulting total voltage noise. The spectral response of the device under test can be determined by performing a Fourier transform on the calculated voltage noise of the device under test. The device under test may be a printed circuit board, an integrated circuit package, an interconnect component, or even a digital representation of a physical device wherein the injected signal and measured response are simulated.

One method of characterizing a device under test in accordance with this invention features determining the impedance of the device under test in the frequency domain by constructing an s-parameter matrix and calculating the real and imaginary portions of the impedance based on the s-parameter matrix, converting the frequency domain impedance to the time domain by performing an inverse Fourier transform on the complex frequency domain impedance, and calculating the voltage noise of the device under test by convolving the time domain impedance of the device under test with a predetermined current in the time domain.

Determining the impedance may include injecting a signal into the device from one or more test ports of an analyzer and measuring the response of the device. Typically, the predetermined current is a current specified for the device under test. The step of constructing the s-parameter matrix typically includes establishing calibration data, generating an uncorrected s-parameter matrix based on the measured impedance of the device under test, and applying the calibration data to the uncorrected s-parameter matrix to calculate a corrected s-parameter matrix.

A system for characterizing a device under test in accordance with this invention includes an input subsystem configured to inject a signal into the device under test and to measure the response of the device under test, a routine responsive to the input subsystem for characterizing the frequency domain impedance of the device under test, a routine configured to convert the frequency domain impedance to a time domain impedance, and a routine configured to calculate the voltage noise of the device under test based on the time domain impedance.

In one example, the input subsystem includes a network analyzer with a plurality of test ports connectable to the device under test for injecting a signal into the device under test and receiving a response from the device under test. An output device is for outputting the calculated voltage noise of the device and a user interface is for inputting a current specified for the device under test.

In the preferred embodiment, the routine for characterizing the frequency domain impedance is configured to construct an s-parameter matrix and to calculate the real and imaginary portions of the impedance based on the s-parameter matrix. A calibration routine establishes calibration data, an uncorrected s-parameter matrix is based on the measured impedances of the device under test, and the calibration data is applied to the uncorrected s-parameter matrix to produce a corrected s-parameter matrix.

The routine configured to convert the frequency domain impedance to a time domain impedance typically performs an inverse Fourier transform on the frequency domain impedance. The routine for calculating the voltage noise of the device under test typically convolves the time domain impedance with a predetermined current.

For a self-impedance measurement, the input subsystem is configured to measure, at a terminal pair of the device under test using one test port of the input subsystem, the response to a signal input to the terminal pair from a different test port of the input subsystem.

For a transfer impedance determination, the input subsystem is configured to measure, at one terminal pair of the device under test using one test port of the input subsystem, the response to a signal input to a different terminal pair of the device under test from a different test port of the input subsystem. Also, the input subsystem may be configured to input a signal to a plurality of terminal pairs of the device under test, the voltage noise at a particular terminal pair of interest on the device under test is calculated, and the simultaneous switching noise is calculated as the sum of all voltage noise signals.

If the device under test has multiple terminal pairs, a signal can be input to each terminal pair by the input subsystem, the voltage noise at a particular terminal pair of interest can be calculated, and the timing of the input signals can then be adjusted until a maximum total voltage noise is achieved to determine a worst case scenario concerning timing of the signals input to each terminal pair and a resulting total voltage noise.

The spectral response of the device under test can be determined by a routine which performs a Fourier transform on the calculated voltage noise of the device under test.

One preferred system for characterizing a device under test in accordance with this invention includes a routine for determining the frequency domain impedance of the device under test by constructing an s-parameter matrix and calculating the real and imaginary portions of the impedance based on the s-parameter matrix. The system preferably also includes a routine for converting the frequency domain impedance to a time domain impedance by performing an inverse Fourier transform on the complex frequency domain impedance and a routine for calculating the voltage noise of the device under test by convolving the time domain impedance with a predetermined current.

Typically an analyzer is configured to inject a signal into the device from one or more test ports and to measure the response of the device. The predetermined current may be a current specified for the device under test.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

Figure 1:
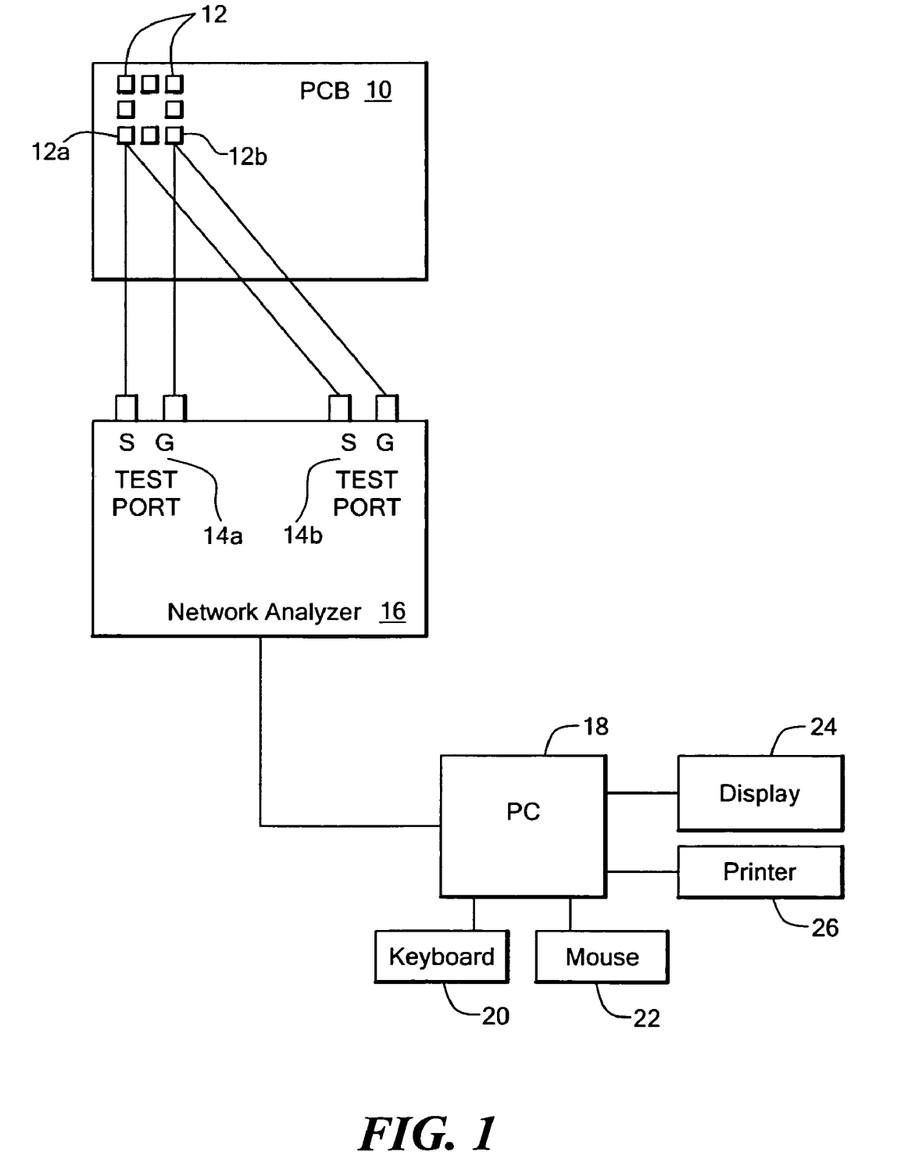
FIG. 1 is a conceptual block diagram of one embodiment of a system for characterizing a device under test in accordance with the subject invention in the self-impedance mode.

FIG. 1 shows a device under test 10 in the form of a printed circuit board. Other possible devices include integrated circuit packages and other electronic systems, devices, and components (e.g., interconnect components such as wire bonds and vias). Also, the "device" under test may be a digital representation of a physical device represented on a computer as is the case in the early design stages of a device when, for example, computer aided design software is used to design and model a new printed circuit board.

Pads 12 are where an electronic chip or package might be mounted to printed circuit board 10 or where a signal return path transitions from one plane to another through a via hole, and the goal of the subject invention is to measure the voltage noise (actual or simulated) of the power delivery network of printed circuit board 10. In this example, pad 12a is a Vcc input pad and pad 12b is a ground pad.

For a self-impedance determination, test ports 14a and 14b of a suitable input subsystem such as network analyzer 16 are connected to pads 12a and 12b using test cables and probes known to those skilled in the art. Measuring low impedances requires great care to eliminate the voltage drop that occurs at the measurement port caused by current flowing in ground loops. There are a number of approaches to reducing this source of error. These include the use of isolation transformers, the use of ferrite beads on the test cables, the use of high quality test cables with low loss shields, and the use of triaxial test cables to shunt stray ground currents, the use of isolation amplifiers, and/or the use of differential measurement techniques rather than single-ended.

Test port 14a of analyzer 16 is used to inject a signal to printed circuit board 10 via pads 12a and 12b. Test port 14b of analyzer 10 is used to measure the response. Computer 18 is connected to network analyzer 16 and includes input devices such as keyboard 20 and/or mouse 22 and output devices such as display 24 and/or printer 26. The output of the program(s) operating on computer 18 is typically the voltage noise of printed circuit board 10. These programs operating on computer 18 initially function to determine the impedance of the power delivery system of device under test 10 as a function of frequency. In the actual implementation of the invention, computer 18 may be a stand-alone external computer, or it may be a CPU integral to the network analyzer. Typically, an s-parameter matrix is constructed based on calibration data established before analyzer 16 is used to measure the device under test. Based on the s-parameter matrix, the real and imaginary portions of the impedance of the device under test as a function of frequency is calculated. Next, an inverse Fourier transform is performed on the impedance as a function of frequency to convert the frequency into the time domain. In the final step, the impedance in the time domain is convolved with a predetermined current waveform (input by the user of computer 18, for example) to determine the voltage noise. Each step in this process is explained in more detail below.

S-parameters provide an ideal starting point for the characterization of power delivery systems of high-speed printed circuit boards and IC packages because of the technical advantages of frequency domain simulation and measurement over comparable time domain techniques. Computer-based circuit design tools (EDA software) that use circuit simulation or electromagnetic simulation techniques need to be able to accurately consider the properties of the materials and components used to construct the device. These properties are naturally described in the frequency domain and can not be described accurately in the time domain.

Measurement instruments that operate in the frequency domain are likewise better suited to testing power delivery networks than time domain instruments. Compared to time domain measurements, frequency domain measurements offer increased accuracy due to better error correction techniques, and higher dynamic range and measurement bandwidth due to their use of narrow-band tuned receiver technology. The accuracy and bandwidth considerations are both key elements for characterizing the power delivery networks of a high-speed device.

Frequency domain measurements typically involve determining the s-parameters of the device since direct measurement of state variables such as impedance or admittance is not possible at higher frequencies. Because there is an established relationship between the s-parameters and the impedance, measuring s-parameters allows the impedance in the frequency domain to be determined. A common technique for determining this impedance is to use a one-port (reflection only) s-parameter measurement (S11) and transform it to impedance (Z) according to:

$$Z = Z0 \cdot \frac{(1+S11)}{(1-S11)} \quad (1)$$

where Z0 is the reference impedance for which the s-parameters are defined.

The drawback to this approach is that the further Z is from Z0, the more error is introduced in the measurement. Since power delivery network impedances are typically less than $\frac{1}{1000}$ of Z0, reflection measurements are generally inadequate for measuring these types of devices under test. Although for higher impedance devices, this approach may be adequate.

The impedance can also be measured by using transmission techniques rather than reflection. This offers an immediate advantage since a network analyzer has twice the dynamic range in transmission as it does in reflection when each are expressed in decibels. The self-impedance of a device can be determined by using a technique similar to a four-point impedance measurement performed with an ohm meter at dc. It involves making a calibrated two-port s-parameter measurement using a network analyzer, where both test ports are co-located at the point of interest as shown in FIG. 1. The real and imaginary portions of the impedance is determined from the s-parameters according to:

$$\text{Re}(Z) = \frac{Z0}{2} \cdot \frac{\text{Re}(S21) \cdot [1-\text{Re}(S21)-\text{Im}(S21)^2]}{[(1-\text{Re}(S21))^2+\text{Im}(S21)^2]}, \text{ and} \quad (2)$$

$$\text{Im}(Z) = \frac{Z0}{2} \cdot \frac{\text{Im}(S21) \cdot [1-\text{Re}(S21)+\text{Re}(S21) \cdot \text{Im}(S21)]}{[(1-\text{Re}(S21))^2+\text{Im}(S21)^2]} \quad (3)$$

where Z0 is the reference impedance for which the s-parameters are defined.

If $|Z| \ll Z0/2$, these equations reduce to $$Z \approx \frac{Z0}{2} \cdot S21 \quad (4)$$

Using modern network analyzers, this technique allows impedances of less than 1 mΩ to be accurately measured to frequencies of greater than 20 GHz.

Measuring the s-parameters over frequency thus allows the impedance of the power delivery network or pair of planes to be determined as a function of frequency. As delineated above, even though it is recognized that frequency domain techniques provide a more accurate characterization of a device under test, the general lack of understanding of the concept of a time domain representation of impedance has led to the improper use of this information in the design and characterization of power delivery systems.

Figure 5A:
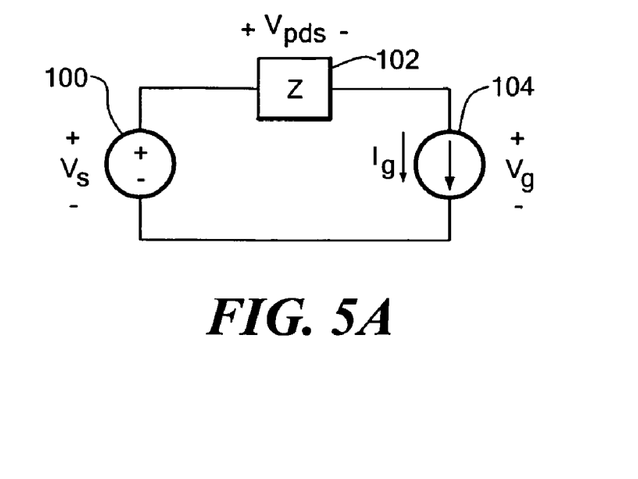
FIGS. 5A–5C are electrical schematic diagrams of a power delivery network including a power supply, power planes, and transient switching load such as a logic gate or I/O driver.

To illustrate these concepts, assume that the portion of the printed circuit board of interest can be electrically modeled such that a voltage source 100, FIG. 5A represents the power supply that provides current to the power delivery network at a constant voltage. An impedance element 102 models the electrical characteristics of the power delivery network. Current source 104 represents the circuitry that draws current from the power supply. The current through current source 104, Ig, varies with time. In steady state, the voltage at the current source, Vg, is equal to the supply voltage less any IR drop due to ohmic losses in the power delivery network. In practice Vg can vary considerably from its nominal value when Ig changes due to transients caused by reactive components of the impedance of the power delivery network interacting with the changing current of the current source, Ig.

Figure 5B:
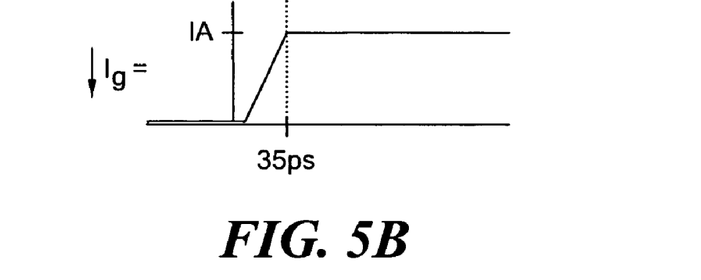

For example, as shown in FIG. 5B, the current source steps by 1 A in a time of 35 ps, and the source voltage must not change by more than 35 mV according to a predetermined specification for the circuit board, then according to the conventional technique, the magnitude of the impedance of the PDS must be less than 35 mΩ over a bandwidth of $$BW = \frac{0.35}{Trise} = \frac{0.35}{35 \text{ pS}} = 10 \text{ GHz}. \quad (5)$$

Figure 5C:
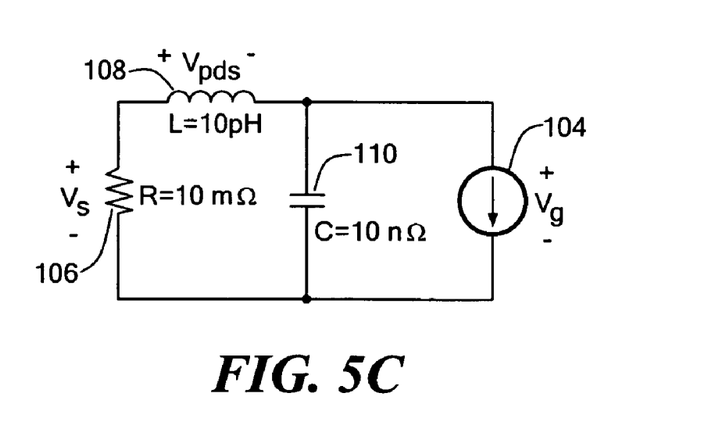

Now consider an equivalent circuit model, FIG. 5C, that describes the electrical behavior of the power delivery system where resistor 106 represents the impedance of the power supply, inductance 108 represents the current path on the plane, and capacitor 110 represents the capacitance between the power plane and the ground plane of the power delivery network. The impedance of this circuit as seen from the terminal where the current source is connected has been simulated to show that the maximum impedance is seen to be 106 mΩ at a frequency of 500 MHz.

According to conventional techniques, the performance of this power delivery network would be deemed inadequate since the 106 mΩ impedance of the power delivery system is larger than the 35 mΩ target specified impedance.

This can be verified by using a circuit simulator to determine the transient response of the voltage, Vg, resulting from a step in the current, Ig, or for this simple example, by calculating the noise across the inductor according to $$V = L\frac{\Delta I}{\Delta t}.$$

The transient noise is 33.5 mV, considerably less than 106 mV, and within the performance requirements. Therefore, the conventional technique clearly yields incorrect results, even for simple circuits, because, as stated above, parameters in the frequency domain are incorrectly calculated with parameters in the time domain.

A more rigorous mathematical treatment of the circuit in accordance with the subject invention provides the correct answer. The voltage Vg can be expressed as:

$$Vg=Vs-Vpds \quad (6)$$

The voltage drop across the power delivery system, Vpds, can be determined from the impedance of the power delivery system and the current through it according to:

$$Vpds(f)=Ig(f)*Zpds(f) \quad (7)$$

The impedance of the power delivery system, Zpds, from equations (2)–(4), can be considered a transfer function that relates the current through a device to the voltage across it. Equivalently, the voltage across the power delivery system can be described in the time domain according to:

$$Vpds(t)=Ig(t)*Zpds(t), \quad (8)$$

where the * operator is the convolusion of the two terms.

Time domain is the form of interest for this application since Vpds must be expressed in the time domain to determine the voltage noise and Ig, the specified current is naturally defined as a function of time. The remaining term, Zpds, was normally expressed as a function of frequency. Since the impedance can be considered a transfer function, the frequency domain description (equations (2)–(4)) can be equivalently described in the time domain by performing an inverse Fourier transform of the frequency domain expression. There are many techniques for performing the inverse Fourier transform, including numerical techniques such as the Inverse Fast Fourier Transform for discrete data. The mathematical operator between the current and the impedance of equation (8) is a convolusion integral. In this example, a step response has been calculated, so Ig(t) is a step function.

Calculating the transient voltage, Vpds(t), (equation (8)) can be accomplished by determining the time domain step response of the impedance, Zpds, and multiplying by the magnitude of the current step.

Returning to the above example, using the method of this invention, the maximum noise transient noise is determined to be 33.7 mV, which agrees very well with the results of the circuit simulation described earlier. The result is that a printed circuit board thought to be too noisy when analyzed by conventional techniques is in fact within specified tolerances when characterized by the subject invention where the impedance in the frequency domain is converted to the time domain before the noise determination is made.

One difference between this approach and the conventional approach is that the conventional approach does not take into consideration that the current waveform has a characteristic spectral response, and that each frequency component of the signal is presented with a unique impedance by the power delivery network. If the peak in the impedance of the power delivery network happens to occur at a frequency where the signal has no energy, the transient voltage will not be degraded. Conversely, if all of the energy is concentrated at the frequency of the impedance peak, the transient voltage will be the worst case value that the conventional technique estimates. More generally it can be stated that the suitability of a particular power delivery network impedance profile depends on the characteristics of the current waveform, including the signal rise time, the magnitude of the current step, and data pattern.

Typically, the routines operating on computer 18, FIG. 1 function to run a set up routine where, for example, the user can enter a specified current waveform (I(g)(t) from equation (8)), step 40, FIG. 2, and to calibrate the system after set-up, step 42 as disclosed below. Analyzer 16, FIG. 1 injects a signal into the device from one or more test ports 14a and/or 14b and measures the response of the device. The impedance of the device under test as a function of frequency is then determined by constructing an s-parameter matrix, step 44, FIG. 2, constructing a corrected s-parameter matrix, step 46, and calculating the real and imaginary portions of the impedance based on the corrected s-parameter matrix, step 48, using equations (2)–(4). The impedance of the device under test in the time domain is then calculated by performing an inverse Fourier transform on the complex impedance in the frequency domain, step 50. The voltage noise of the device under test is then calculated, step 52, by convolving the impedance of the device under test in the time domain with a predetermined current signal as a function of time using equation (8). The output on display 24 and/or printer 26, FIG. 1, is typically the voltage noise which is compared to a maximum allowable voltage noise for the device under test.

Figure 2:
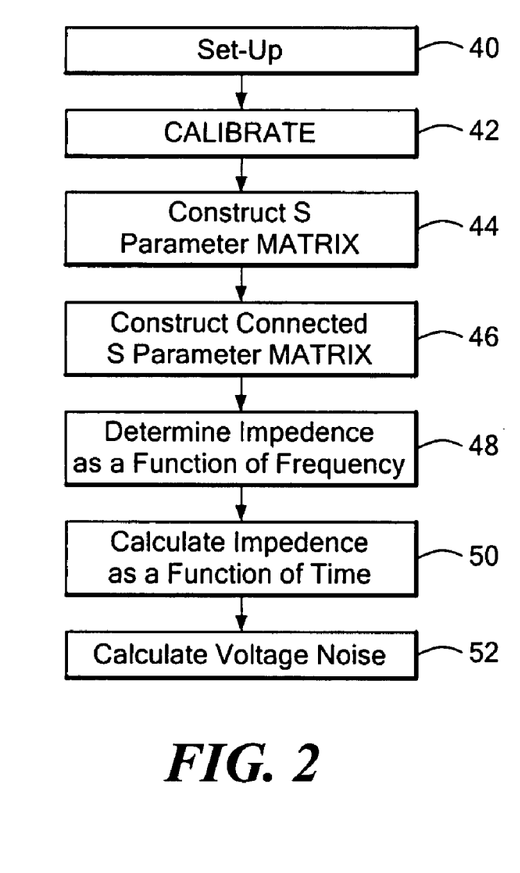
FIG. 2 is a flow chart showing the primary functions carried out by the software operating on the computer portion of the system shown in FIG. 1.

Preferably, the calibration data of step 42, FIG. 2 is applied to the uncorrected s-parameter matrix generated by the raw output of analyzer 16, FIG. 1 to calculate a corrected s-parameter matrix, step 46, FIG. 2.

Thus far, the impedance determined is self-impedance and FIG. 1 shows a configuration where, at terminal pair 12a and 12b using one test port of analyzer 16, the response is measured to a signal input to the terminal pair 12a and 12b from a different test port 14b of analyzer 16.

Figure 3:
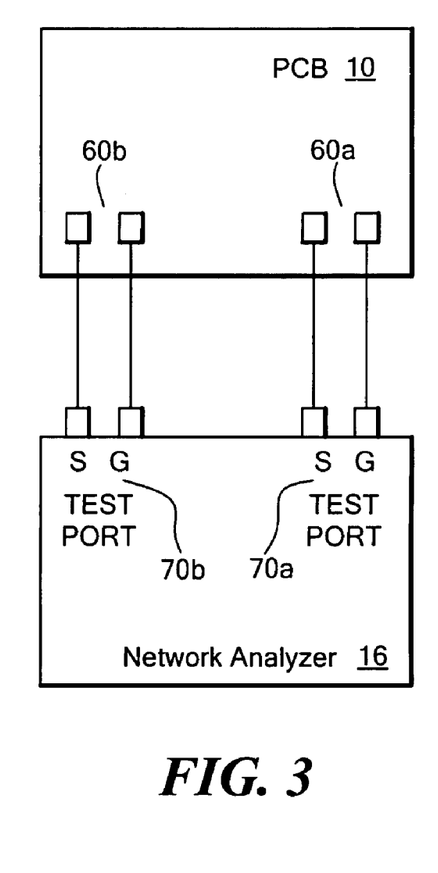
FIG. 3 is another conceptual block diagram showing how a network analyzer in accordance with the subject invention is connected to the pads of a printed circuit board in order to measure the transfer impedance of the power delivery network of the printed circuit board.

A similar approach can be used to calculate the voltage transient at one terminal, 60a, FIG. 3 that results from current switching at a different terminal 60b. This is calculated by using a transfer-impedance rather than the self-impedance described above. There may be more than the two test terminals shown in FIG. 3. The transfer-impedance is calculated from the s-parameters in the same manner as the self-impedance. The difference is that the s-parameter that is used in the transfer-impedance calculation is measured with the two test ports 70a and 70b of network analyzer 16 connected to two different locations 60a and 60b of device under test 10 instead of being connected to the same location as they are for the self-impedance. The transient voltage that is determined in this scenario is commonly referred to as a switching noise. As with the self-impedance, the magnitude of the voltage transient noise depends on the characteristics of the current switching waveform.

Thus, the step of or routines for determining the transfer impedance of the device under test includes measuring, at terminal pair 60a using test port 70a of analyzer 16, the response to a signal input to a different terminal pair 60b from a different test port 70b of analyzer 16.

Often it is necessary to determine the noise at a particular location that results from switching the current at several other locations simultaneously rather than only switching the current at a single other location. This type of test is commonly called simultaneous switching noise (SSN) or simultaneous switching output noise (SSO). Determining SSN follows the same procedure as determining switching noise, but involves the additional steps of using superposition to combine the results of the each individual switching noise.

Figure 4A:
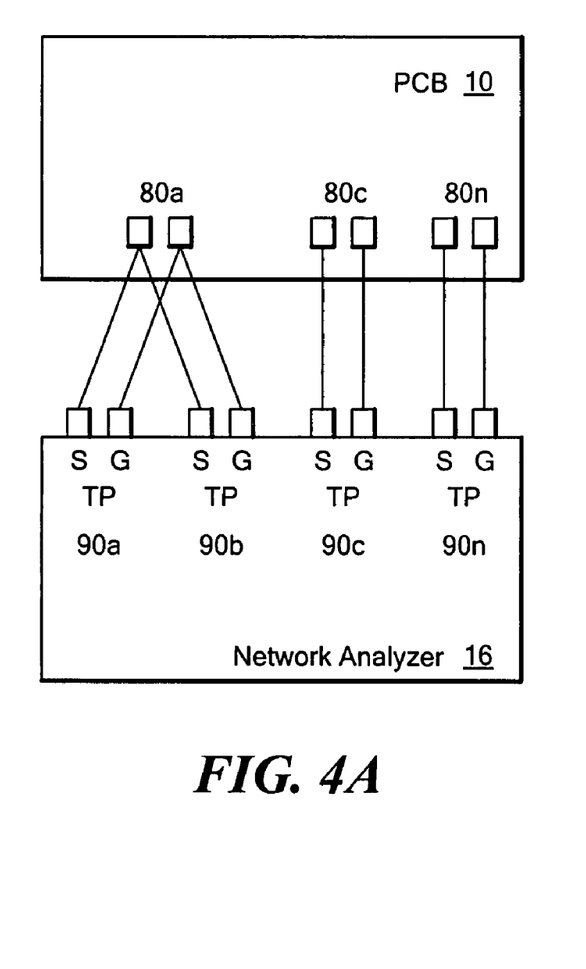
FIGS. 4A and 4B are conceptual block diagram showing two ways the network analyzer portion of the subject invention is connected to the pads of a printed circuit board in order to measure the simultaneous switching noise of the power delivery network of the board in accordance with the method of the subject invention.
Figure 4B:
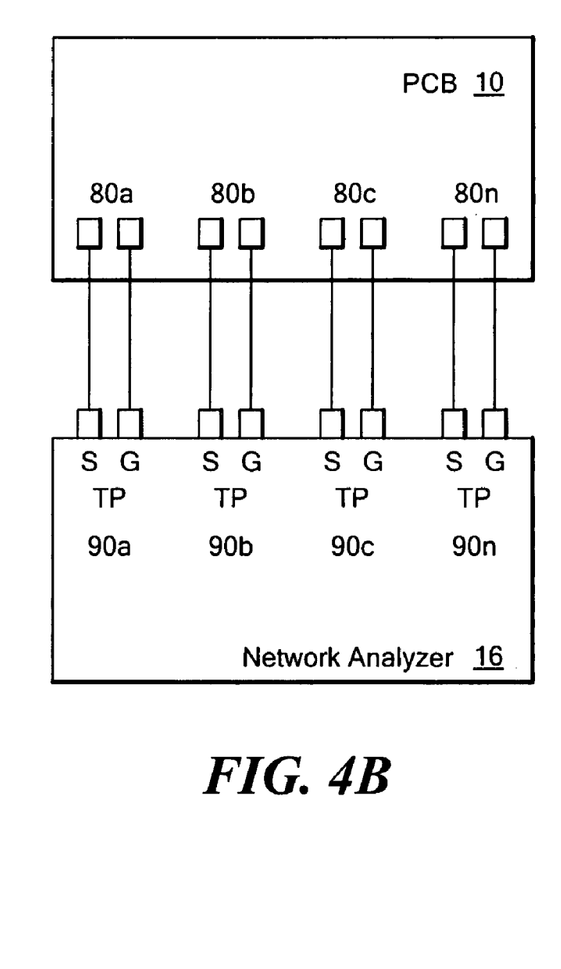

Thus, step of or routine for determining the impedance of the device under test includes measuring the response of a plurality of terminal pairs $80a$, $80b$, $80c$ . . . $80n$, FIG. 4 using different test ports $90a$, $90b$, $90c$ . . . $90n$ of analyzer 16. In one example, current is injected at terminal $80a$ and the noise is calculated at terminal $80a$, current is injected at terminal $80b$ and the noise is calculated at terminal $80a$, current is injected at terminal $80c$ and the noise is calculated at terminal $80a$, and so on until current is injected at terminal $80n$ and the noise is calculated at terminal $80a$. Thus, the voltage noise of each terminal pair of the device under test is calculated and the simultaneous switching noise is then the sum of the voltage noise of each terminal of the device under test. This sum is then compared to a specified maximum simultaneous switching noise. In addition, if device under test has multiple terminal pairs, a worst case scenario concerning timing of the signal inputs to each terminal pair and a resulting total voltage noise can be calculated. Although this example described how to perform SSN characterization using a 2-port network analyzer and making multiple measurements, it is also possible to use the same technique using a multi-port network analyzer and making fewer measurements. For example, an N-port network analyzer can measure the effect of simultaneously switching N ports on device under test with a single measurement.

Finally, a great deal of insight into the device under test can often be gained by viewing the spectral response of a particular digital waveform on a device. By comparing the spectral response of a signal waveform to the frequency characteristics of the device under test, it immediately becomes apparent, for example, whether a spike in the impedance of a power delivery network is likely to have a deleterious effect on the performance of the system. This feature is implemented by performing a Fourier transform on the signal waveform representing the calculated voltage noise of the device under test.

The method and apparatus of the subject invention is thus able to measure the electrical characteristics of the device under test which, in one example, is the power delivery network of a printed circuit board or an integrated circuit package. The method and apparatus involves determining the elements of a scalar orthogonal matrix corresponding to terminals of the device under test. The scalar orthogonal matrix comprises a row of elements representing a single-ended terminal of the device under test. The s-parameters of the device under test are then transformed into impedances between the terminals. The preferred method of and apparatus for characterizing a device involves calibrating a test set, coupling the device to the test set, and measuring s-parameters of the device. The s-parameters are converted to a self-impedance or a transfer-impedance. The impedance is further converted to a time domain representation, and the time domain representation of the impedance is convolved with a simulated input current waveform to generate an output voltage transient response. This general method will determine voltage transient noise by using a self-impedance, switching noise by using a transfer impedance, and simultaneous switching noise by using a plurality of transfer impedances. The output response is then displayed on display 24, FIG. 1.

Proper characterization of a device involves determining the amount of noise on the voltage supplied to the electronic circuit due to an electronic circuit drawing current from the device. Complete characterization of a device involves determining the voltage noise at one terminal when current is drawn from the same terminal (the 'self' term), and determining the voltage noise at one terminal when current is drawn from a different terminal (the 'transfer' term). This is repeated for every combination of terminals.

The transfer terms can also be used in combinations using mathematical superposition to determine the transient voltage noise at one terminal due to the simultaneous switching of the current at several other terminals. This type of test is known as simultaneous switching noise (SSN) as discussed above.

The time domain representation of the voltage is typically calculated by convolving the time domain representation of the current with the time domain representation of the impedance. The time domain representation of the impedance is typically determined by performing an inverse Fourier transform on the frequency domain representation of the impedance. The frequency domain representation of the impedance is determined from the s-parameters of the device.

In the situation where the device under test is digitally represented, the injected signal and the measured response are simulated using the routines operating on computer 18, FIG. 1. Moreover, even where device 10, FIG. 1 is a physical device, the routines operating on computer 18 as described above need not be separate routines. Thus, "routine", as used herein not only means subroutines but also code sections or lines of code which may indeed perform multiple functions.

Thus, although specific features of the invention are shown in some drawings and not in others, this is for convenience only as each feature may be combined with any or all of the other features in accordance with the invention. Moreover, the words "including", "comprising", "having", and "with" as used herein are to be interpreted broadly and comprehensively and are not limited to any physical interconnection. Also, any embodiments disclosed in the subject application are not to be taken as the only possible embodiments. Other embodiments will occur to those skilled in the art and are within the following claims:

What is claimed is:

1. A method of characterizing a device under test, the method comprising:
   injecting a signal into the device under test;
   measuring the response to the injected signal to determine the impedance of the device under test in the frequency domain;
   converting the impedance of the device under test to a time domain; and
   calculating the voltage noise of the device under test based on the impedance in the time domain.

2. The method of claim 1 in which the step of measuring the response includes constructing an s-parameter matrix and calculating the real and imaginary portions of the impedance of the device under test as a function of frequency based on the s-parameter matrix.

3. The method of claim 2 in which the step of construction the s-parameter matrix includes establishing calibration data, generating an uncorrected s-parameter matrix based on the measured impedance of the device under test, and applying the calibration data to the uncorrected s-parameter matrix to produce a corrected s-parameter matrix.

4. The method of claim 1 in which converting includes performing an inverse Fourier transform on the impedance in the frequency domain.

5. The method of claim 1 in which calculating the voltage noise of the device under test includes convolving the impedance in the time domain with a predetermined current in the time domain.

6. The method of claim 1 in which the impedance determined is self-impedance.

7. The method of claim 6 in which the step of determining the impedance of the device under test includes measuring, at a terminal pair of the device under test using one test port of an analyzer, the response to a signal input to the terminal pair from a different test port of the analyzer.

8. The method of claim 1 in which the impedance determined is the transfer impedance.

9. The method of claim 8 in which the step of determining the impedance of the device under test includes measuring, at one terminal pair of the device under test using one test port of an analyzer, the response to a signal input to a different terminal pair of the device under test from a different test port of the analyzer.

10. The method of claim 1 in which the voltage noise calculated is the simultaneous switching noise.

11. The method of claim 10 in which the step of determining the impedance of the device under test includes injecting an input signal to a plurality of terminal pairs of the device under test.

12. The method of claim 11 in which the voltage noise at a particular terminal pair of interest on the device under test is calculated and the simultaneous switching noise is the sum of all voltage noise signals.

13. The method of claim 1 in which the device under test has multiple terminal pairs and the timing of calculated voltage noise of each terminal pair is adjusted until a maximum total voltage noise is achieved to determine a worst case scenario concerning timing of the signal input to each terminal pair and the resulting total voltage noise.

14. The method of claim 1 further including the step of determining the spectral response of the device under test.

15. The method of claim 14 in which the step of determining the spectral response of the device under test includes performing a Fourier transform on the calculated voltage noise of the device under test.

16. The method of claim 1 in which the device under test is a printed circuit board.

17. The method of claim 1 in which the device under test is an integrated circuit package.

18. The method of claim 1 in which the device under test is an interconnect component.

19. The method of claim 1 in which the device under test is a digital representation of a physical device and the injected signal and measured response are simulated.

20. A method of characterizing a device under test, the method comprising:
determining the impedance of the device under test in the frequency domain by constructing an s-parameter matrix and calculating the real and imaginary portions of the impedance based on the s-parameter matrix;
converting the frequency domain impedance of the device under test to a time domain by performing an inverse Fourier transform on the determined complex impedance; and
calculating the voltage noise of the device under test by convolving the time domain impedance with a predetermined current in the time domain.

21. The method of claim 20 in which determining the impedance includes injecting a signal into the device from one or more test ports of an analyzer and measuring the response of the device.

22. The method of claim 20 in which the predetermined current is a current specified for the device under test.

23. The method of claim 20 in which the step of constructing the s-parameter matrix includes establishing calibration data, generating an uncorrected s-parameter matrix based on the measured impedance of the device under test, and applying the calibration data to the uncorrected s-parameter matrix to produce a corrected s-parameter matrix.

24. The method of claim 20 in which the impedance determined is self-impedance.

25. The method of claim 20 in which the step of determining the impedance of the device under test includes measuring, at a terminal pair of the device under test using one test port of an analyzer, the response to a signal input to the terminal pair from a different test port of the analyzer.

26. The method of claim 20 in which the impedance determined is the transfer impedance.

27. The method of claim 26 in which the step of determining the impedance of the device under test includes measuring, at one terminal pair of the device under test using one test port of an analyzer, the response to a signal input to a different terminal pair of the device under test from a different test port of the analyzer.

28. The method of claim 20 in which the voltage noise calculated is the simultaneous switching noise.

29. The method of claim 28 in which the step of determining the impedance of the device under test includes measuring the response of a plurality of terminal pairs of the device under test.

30. The method of claim 29 in which the voltage noise of each terminal pair of the device under test is calculated and the simultaneous switching noise is the sum of the voltage noise of each terminal of the device under test.

31. The method of claim 20 in which the device under test has multiple terminal pairs, a signal is input to each terminal pair, and the calculated voltage noise of each terminal pair is adjusted until a maximum total voltage noise is achieved to determine a worst case scenario concerning timing of the signal input to each terminal pair and a resulting total voltage noise.

32. The method of claim 20 further including the step of determining the spectral response of the device under test.

33. The method of claim 32 in which the step of determining the spectral response of the device under test includes performing a Fourier transform on the calculated voltage noise of the device under test.

34. The method of claim 20 in which the device under test is a printed circuit board.

35. The method of claim 20 in which the device under test is an integrated circuit package.

36. The method of claim 20 in which the device under test is an interconnect component.

37. The method of claim 20 in which the device under test is a digital representation of a physical device.

38. A system for characterizing a device under test, the system comprising:
an input subsystem configured to inject a signal into the device under test and measure the response of the device under test;
a routine responsive to the input subsystem for characterizing the frequency domain impedance of the device under test;

a routine configured to convert the frequency domain impedance to a time domain impedance; and a routine configured to calculate the voltage noise of the device under test based on the time domain impedance.

39. The system of claim 38 in which the input subsystem includes a network analyzer.

40. The system of claim 39 in which the network analyzer includes a plurality of test ports connectable to the device under test for injecting a signal into the device under test and receiving a response from the device under test.

41. The system of claim 38 further including an output device for outputting the calculated voltage noise of the device.

42. The system of claim 38 further including a user interface for inputting a current specified for the device under test.

43. The system of claim 38 in which the routine for characterizing the frequency domain impedance is configured to construct an s-parameter matrix and to calculate the real and imaginary portions of the impedance based on the s-parameter matrix.

44. The system of claim 43 further including a calibration routine for establishing calibration data, an uncorrected s-parameter matrix is based on the measured impedances of the device under test, and the calibration data is applied to the uncorrected s-parameter matrix to produce a corrected s-parameter matrix.

45. The system of claim 38 in which the routine configured to convert the frequency domain impedance to a time domain impedance performs an inverse Fourier transform on the frequency domain impedance.

46. The system of claim 38 in which the routine for calculating the voltage noise of the device under test convolves the time domain impedance with a predetermined current.

47. The system of claim 38 in which the impedance determined is self-impedance.

48. The system of claim 38 in which the input subsystem is configured to measure, at a terminal pair of the device under test using one test port of the input subsystem, the response to a signal input to the terminal pair from a different test port of the input subsystem.

49. The system of claim 38 in which the impedance determined is the transfer impedance.

50. The system of claim 49 in which the input subsystem is configured to measure, at one terminal pair of the device under test using one test port of the input subsystem, the response to a signal input to a different terminal pair of the device under test from a different test port of the input subsystem.

51. The system of claim 38 in which the voltage noise calculated is the simultaneous switching noise.

52. The system of claim 51 in which the input subsystem is configured to input a signal to a plurality of terminal pairs of the device under test.

53. The system of claim 52 in which the voltage noise at a particular terminal pair of interest on the device under test is calculated and the simultaneous switching noise is calculated as the sum of all voltage noise signals.

54. The system of claim 38 in which the device under test has multiple terminal pairs, a signal is input to each terminal pair by the input subsystem, and the voltage noise at a particular terminal pair of interest is calculated and the timing of the input signals is adjusted until a maximum total voltage noise is achieved to determine a worst case scenario concerning timing of the signal inputs to each terminal pair and a resulting total voltage noise.

55. The system of claim 38 further including a routine for determining the spectral response of the device under test.

56. The system of claim 55 in which the routine for determining the spectral response of the device under test performs a Fourier transform on the calculated voltage noise of the device under test.

57. The system of claim 38 in which the device under test is a printed circuit board.

58. The system of claim 38 in which the device under test is an integrated circuit package.

59. The system of claim 38 in which the device under test is an interconnect component.

60. The system of claim 38 in which the device under test is a digital representation of a physical device and the input subsystem simulates an injected signal and a response.

61. A system for characterizing a device under test, the system comprising:

a routine for determining the frequency domain impedance of the device under test by constructing an s-parameter matrix and calculating the real and imaginary portions of the impedance based on the s-parameter matrix;

a routine for converting the frequency domain impedance to a time domain impedance by performing an inverse Fourier transform on the complex impedance; and a routine for calculating the voltage noise of the device under test by convolving the time domain impedance with a predetermined current.

62. The system of claim 61 in which further including an analyzer configured to inject a signal into the device from one or more test ports and to measure the response of the device.

63. The system of claim 61 in which the predetermined current is a current specified for the device under test.

64. A method of characterizing a device under test, the method comprising:

injecting a signal into the device under test;

measuring the response to the injected signal to determine the impedance of the device under test in the frequency domain including:

construct an s-parameter matrix including:

establishing calibration data, generating an uncorrected s-parameter matrix based on the measured impedance of the device under test, and applying the calibration data to the uncorrected s-parameter matrix to produce a corrected s-parameter matrix, calculating the real and imaginary portions of the impedance of the device under test as a function of frequency based on the s-parameter matrix;

converting the impedance of the device under test to a time domain; and calculating the voltage noise of the device under test based on the impedance in the time domain.

65. A method of characterizing a device under test, the method comprising:

injecting a signal into the device under test;

measuring the response to the injected signal to determine the self-impedance of the device under test in the frequency domain;

converting the self-impedance of the device under test to a time domain; and calculating the voltage noise of the device under test based on the self-impedance in the time domain.

66. The method of claim 65 in which the step of determining the self-impedance of the device under test includes measuring, at a terminal pair of the device under test using one test port of an analyzer, the response to a signal input to the terminal pair from a different test port of the analyzer.

67. A method of characterizing a device under test, the method comprising:
injecting a signal into the device under test;
measuring the response to the injected signal to determine the transfer impedance of the device under test in the frequency domain;
converting the transfer impedance of the device under test to a time domain; and
calculating the voltage noise of the device under test based on the transfer impedance in the time domain.

68. The method of claim 67 in which the step of determining the transfer impedance of the device under test includes measuring, at one terminal pair of the device under test using one test port of an analyzer, the response to a signal input to a different terminal pair of the device under test from a different test port of the analyzer.

69. A method of characterizing a device under test, the method comprising:
injecting a signal into the device under test;
measuring the response to the injected signal to determine the impedance of the device under test in the frequency domain;
converting the impedance of the device under test to a time domain; and
calculating the simultaneous switching voltage noise of the device under test based on the impedance in the time domain.

70. The method of claim 69 in which the step of determining the impedance of the device under test includes injecting an input signal to a plurality of terminal pairs of the device under test.

71. The method of claim 70 in which the voltage noise at a particular terminal pair of interest on the device under test is calculated and the simultaneous switching noise is the sum of all voltage noise signals.

72. A method of characterizing a device under test, the method comprising:
injecting a signal into the device under test;
measuring the response to the injected signal to determine the impedance of the device under test in the frequency domain;
converting the impedance of the device under test to a time domain; and
calculating the voltage noise of the device under test based on the impedance in the time domain,
wherein the device under test has multiple terminal pairs and the timing of calculated voltage noise of each terminal pair is adjusted until a maximum total voltage noise is achieved to determine a worst case scenario concerning timing of the signal input to each terminal pair and the resulting total voltage noise.

73. A method of characterizing a device under test, the method comprising:
injecting a signal into the device under test;
measuring the response to the injected signal to determine the impedance of the device under test in the frequency domain;
converting the impedance of the device under test to a time domain;
calculating the voltage noise of the device under test based on the impedance in the time domain; and
determining the spectral response of the device under test.

74. The method of claim 73 in which the step of determining the spectral response of the device under test includes performing a Fourier transform on the calculated voltage noise of the device under test.

75. A method of characterizing a device under test, the method comprising:
injecting a signal into the device under test;
measuring the response to the injected signal to determine the impedance of the device under test in the frequency domain;
converting the impedance of the device under test to a time domain; and
calculating the voltage noise of the device under test based on the impedance in the time domain,
wherein the device under test is a digital representation of a physical device and the injected signal and measured response are simulated.

76. A method of characterizing a device under test, the method comprising:
determining the impedance of the device under test in the frequency domain by constructing an s-parameter matrix and calculating the real and imaginary portions of the impedance based on the s-parameter matrix;
converting the frequency domain impedance of the device under test to a time domain by performing an inverse Fourier transform on the determined complex impedance; and
calculating the voltage noise of the device under test by convolving the time domain impedance with a current specified for the device under test in the time domain.

77. A method of characterizing a device under test, the method comprising:
determining the impedance of the device under test in the frequency domain by constructing an s-parameter matrix including establishing calibration data, generating an uncorrected s-parameter matrix based on the measured impedance of the device under test, and applying the calibration data to the uncorrected s-parameter matrix to produce a corrected s-parameter matrix, and calculating the real and imaginary portions of the impedance based on the s-parameter matrix;
converting the frequency domain impedance of the device under test to a time domain by performing an inverse Fourier transform on the determined complex impedance; and
calculating the voltage noise of the device under test by convolving the time domain impedance with a predetermined current in the time domain.

78. A method of characterizing a device under test, the method comprising:
determining the self-impedance of the device under test in the frequency domain by constructing an s-parameter matrix and calculating the real and imaginary portions of the impedance based on the s-parameter matrix;
converting the frequency domain self-impedance of the device under test to a time domain by performing an inverse Fourier transform on the determined complex impedance; and
calculating the voltage noise of the device under test by convolving the time domain impedance with a predetermined current in the time domain.

79. A method of characterizing a device under test, the method comprising:
determining the impedance of the device under test in the frequency domain by constructing an s-parameter matrix including measuring, at a terminal pair of the device under test using one test port of an analyzer, the response to a signal input to the terminal pair from a different test port of the analyzer, and calculating the real and imaginary portions of the impedance based on the s-parameter matrix;

converting the frequency domain impedance of the device under test to a time domain by performing an inverse Fourier transform on the determined complex impedance; and calculating the voltage noise of the device under test by convolving the time domain impedance with a predetermined current in the time domain.

80. A method of characterizing a device under test, the method comprising:

determining the transfer impedance of the device under test in the frequency domain by constructing an s-parameter matrix and calculating the real and imaginary portions of the transfer impedance based on the s-parameter matrix;

converting the frequency domain transfer impedance of the device under test to a time domain by performing an inverse Fourier transform on the determined complex impedance; and calculating the voltage noise of the device under test by convolving the time domain impedance with a predetermined current in the time domain.

81. The method of claim 80 in which the step of determining the transfer impedance of the device under test includes measuring, at one terminal pair of the device under test using one test port of an analyzer, the response to a signal input to a different terminal pair of the device under test from a different test port of the analyzer.

82. A method of characterizing a device under test, the method comprising:

determining the impedance of the device under test in the frequency domain by constructing an s-parameter matrix and calculating the real and imaginary portions of the impedance based on the s-parameter matrix;

converting the frequency domain impedance of the device under test to a time domain by performing an inverse Fourier transform on the determined complex impedance; and calculating the simultaneous switching voltage noise of the device under test by convolving the time domain impedance with a predetermined current in the time domain.

83. The method of claim 82 in which the step of determining the impedance of the device under test includes measuring the response of a plurality of terminal pairs of the device under test.

84. The method of claim 83 in which the voltage noise of each terminal pair of the device under test is calculated and the simultaneous switching noise is the sum of the voltage noise of each terminal of the device under test.

85. A method of characterizing a device under test, the method comprising:

determining the impedance of the device under test in the frequency domain by constructing an s-parameter matrix and calculating the real and imaginary portions of the impedance based on the s-parameter matrix;

converting the frequency domain impedance of the device under test to a time domain by performing an inverse Fourier transform on the determined complex impedance; and calculating the voltage noise of the device under test by convolving the time domain impedance with a predetermined current in the time domain, wherein the device under test has multiple terminal pairs, a signal is input to each terminal pair, and the calculated voltage noise of each terminal pair is adjusted until a maximum total voltage noise is achieved to determine a worst case scenario concerning timing of the signal input to each terminal pair and a resulting total voltage noise.

86. A method of characterizing a device under test, the method comprising:

determining the impedance of the device under test in the frequency domain by constructing an s-parameter matrix and calculating the real and imaginary portions of the impedance based on the s-parameter matrix;

converting the frequency domain impedance of the device under test to a time domain by performing an inverse Fourier transform on the determined complex impedance;

calculating the voltage noise of the device under test by convolving the time domain impedance with a predetermined current in the time domain; and determining the spectral response of the device under test.

87. A method of characterizing a printed circuit board, the method comprising:

determining the impedance of the printed circuit board in the frequency domain by constructing an s-parameter matrix and calculating the real and imaginary portions of the impedance based on the s-parameter matrix;

converting the frequency domain impedance of the printed circuit board to a time domain by performing an inverse Fourier transform on the determined complex impedance; and calculating the voltage noise of the printed circuit board by convolving the time domain impedance with a predetermined current in the time domain.

88. A method of characterizing an integrated circuit package, the method comprising:

determining the impedance of the integrated circuit package in the frequency domain by constructing an s-parameter matrix and calculating the real and imaginary portions of the impedance based on the s-parameter matrix;

converting the frequency domain impedance of the integrated circuit package to a time domain by performing an inverse Fourier transform on the determined complex impedance; and calculating the voltage noise of the integrated circuit package by convolving the time domain impedance with a predetermined current in the time domain.

89. A method of characterizing a digital representation of a physical device, the method comprising:

determining the impedance of the digital representation of a physical device in the frequency domain by constructing an s-parameter matrix and calculating the real and imaginary portions of the impedance based on the s-parameter matrix;

converting the frequency domain impedance of the digital representation of a physical device to a time domain by performing an inverse Fourier transform on the determined complex impedance; and calculating the voltage noise of the digital representation of a physical device by convolving the time domain impedance with a predetermined current in the time domain.

90. A system for characterizing a device under test, the system comprising:

an input subsystem configured to inject a signal into the device under test and measure the response of the device under test;

a routine responsive to the input subsystem for characterizing the frequency domain impedance of the device under test;
a routine configured to convert the frequency domain impedance to a time domain impedance;
a routine configured to calculate the voltage noise of the device under test based on the time domain impedance; and
an output device for outputting the calculated voltage noise of the device.

91. A system for characterizing a device under test, the system comprising:
an input subsystem configured to inject a signal into the device under test and measure the response of the device under test;
a routine responsive to the input subsystem for characterizing the frequency domain impedance of the device under test;
a routine configured to convert the frequency domain impedance to a time domain impedance;
a routine configured to calculate the voltage noise of the device under test based on the time domain impedance; and
a user interface for inputting a current specified for the device under test.

92. A system for characterizing a device under test, the system comprising:
an input subsystem configured to inject a signal into the device under test and measure the response of the device under test;
a routine responsive to the input subsystem for characterizing the frequency domain impedance of the device under test configured to construct an s-parameter matrix and to calculate the real and imaginary portions of the impedance based on the s-parameter matrix;
a routine configured to convert the frequency domain impedance to a time domain impedance;
a routine configured to calculate the voltage noise of the device under test based on the time domain impedance; and
a calibration routine for establishing calibration data, an uncorrected s-parameter matrix is based on the measured impedances of the device under test, and the calibration data is applied to the uncorrected s-parameter matrix to produce a corrected s-parameter matrix.

93. A system for characterizing a device under test, the system comprising:
an input subsystem configured to inject a signal into the device under test and measure the response of the device under test;
a routine responsive to the input subsystem for characterizing the frequency domain self-impedance of the device under test;
a routine configured to convert the frequency domain self-impedance to a time domain impedance; and
a routine configured to calculate the voltage noise of the device under test based on the time domain impedance.

94. A system for characterizing a device under test, the system comprising:
an input subsystem configured to inject a signal into the device under test and measure the response of the device under test, the input subsystem further configured to measure, at a terminal pair of the device under test using one test port of the input subsystem, the response to a signal input to the terminal pair from a different test port of the input subsystem;
a routine responsive to the input subsystem for characterizing the frequency domain impedance of the device under test;
a routine configured to convert the frequency domain impedance to a time domain impedance; and
a routine configured to calculate the voltage noise of the device under test based on the time domain impedance.

95. A system for characterizing a device under test, the system comprising:
an input subsystem configured to inject a signal into the device under test and measure the response of the device under test;
a routine responsive to the input subsystem for characterizing the frequency domain transfer impedance of the device under test;
a routine configured to convert the frequency transfer domain impedance to a time domain impedance; and
a routine configured to calculate the voltage noise of the device under test based on the time domain impedance.

96. The system of claim 95 in which the input subsystem is configured to measure, at one terminal pair of the device under test using one test port of the input subsystem, the response to a signal input to a different terminal pair of the device under test from a different test port of the input subsystem.

97. A system for characterizing a device under test, the system comprising:
an input subsystem configured to inject a signal into the device under test and measure the response of the device under test;
a routine responsive to the input subsystem for characterizing the frequency domain impedance of the device under test;
a routine configured to convert the frequency domain impedance to a time domain impedance; and
a routine configured to calculate the simultaneous switching voltage noise of the device under test based on the time domain impedance.

98. The system of claim 97 in which the input subsystem is configured to input a signal to a plurality of terminal pairs of the device under test.

99. The system of claim 98 in which the voltage noise at a particular terminal pair of interest on the device under test is calculated and the simultaneous switching noise is calculated as the sum of all voltage noise signals.

100. A system for characterizing a device under test, the system comprising:
an input subsystem configured to inject a signal into the device under test and measure the response of the device under test;
a routine responsive to the input subsystem for characterizing the frequency domain impedance of the device under test;
a routine configured to convert the frequency domain impedance to a time domain impedance; and
a routine configured to calculate the voltage noise of the device under test based on the time domain impedance,
wherein the device under test has multiple terminal pairs, a signal is input to each terminal pair by the input subsystem, and the voltage noise at a particular terminal pair of interest is calculated and the timing of the input signals is adjusted until a maximum total voltage noise is achieved to determine a worst case scenario concerning timing of the signal inputs to each terminal pair and a resulting total voltage noise.

101. A system for characterizing a device under test, the system comprising:
- an input subsystem configured to inject a signal into the device under test and measure the response of the device under test;
- a routine responsive to the input subsystem for characterizing the frequency domain impedance of the device under test;
- a routine configured to convert the frequency domain impedance to a time domain impedance;
- a routine configured to calculate the voltage noise of the device under test based on the time domain impedance; and
- a routine for determining the spectral response of the device under test.

102. The system of claim 101 in which the routine for determining the spectral response of the device under test performs a Fourier transform on the calculated voltage noise of the device under test.

103. A system for characterizing a device under test, the system comprising:
- an input subsystem configured to simulate an injected signal and a response to inject a signal into the device under test and measure the response of the device under test;
- a routine responsive to the input subsystem for characterizing the frequency domain impedance of the device under test;
- a routine configured to convert the frequency domain impedance to a time domain impedance; and
- a routine configured to calculate the voltage noise of the device under test based on the time domain impedance,
- wherein the device under test is a digital representation of a physical device.

104. A system for characterizing a device under test, the system comprising:
- a routine for determining the frequency domain impedance of the device under test by constructing an s-parameter matrix and calculating the real and imaginary portions of the impedance based on the s-parameter matrix;
- a routine for converting the frequency domain impedance to a time domain impedance by performing an inverse Fourier transform on the complex impedance; and
- a routine for calculating the voltage noise of the device under test by convolving the time domain impedance with a current specified for the device under test.

* * * * *